United States Patent [19]

Yokogawa et al.

[11] 4,393,513

[45] Jul. 12, 1983

[54] INPUT SIGNAL LEVEL CONTROL DEVICE FOR RECEIVER

[75] Inventors: Tomoshisa Yokogawa; Shintaro Gomi, both of Saitama, Japan

[73] Assignee: Pioneer Electric Corporation, Tokyo, Japan

[21] Appl. No.: 263,543

[22] Filed: May 14, 1981

[30] Foreign Application Priority Data

May 19, 1980 [JP] Japan .............................. 55-68535[U]

[51] Int. Cl.³ .......................... H04B 1/16; H03G 3/30
[52] U.S. Cl. .................................... 455/243; 455/249; 455/253; 330/280; 330/284
[58] Field of Search ............... 455/239, 242, 243, 245, 455/249, 250, 253; 330/284

[56] References Cited

U.S. PATENT DOCUMENTS

| 3,431,506 | 3/1969 | Hirshfield et al. | 330/284 |
| 3,490,046 | 1/1970 | Russell | 455/250 |
| 4,057,765 | 11/1977 | Schuermann | 330/284 |
| 4,147,991 | 4/1979 | Ijichi et al. | 455/253 |

Primary Examiner—Jin F. Ng
Attorney, Agent, or Firm—Sughrue, Mion, Zinn, Macpeak and Seas

[57] ABSTRACT

An input signal level control device for a receiver particularly adapted for use in a mobile FM receiver in which the received electric field strength changes abruptly and greatly. An attenuating device such as a switching diode is coupled to an input of a high frequency amplifier to which the input received signal is fed. The attenuating device switches on when the received electric field strength reaches the first predetermined value. As the electric field strength continues to increase and reaches a second value greater than the first, a control circuit controls the gain of the high frequency amplifier in accordance with the electric field strength.

8 Claims, 2 Drawing Figures

INPUT SIGNAL LEVEL CONTROL DEVICE FOR RECEIVER

BACKGROUND OF THE INVENTION

The present invention relates to an input signal level control device for a receiver. More particularly, the invention relates to an input signal level control device which is suitable for an FM receiver.

In a mobile FM receiver, the received electric field strength changes abruptly and greatly. When the field strength is large, the input high frequency amplifying element tends to be saturated so that the signal is subject to distortion by cross modulation and intermodulation.

In order to eliminate these difficulties, a technique has been employed in which an attenuator is interposed between the antenna terminal and the high frequency (radio frequency) amplifier circuit to attenuate the level of input signals to the high frequency amplifier circuit. The attenuator is activated by a manual switch to eliminate the above-described drawbacks which are caused when the field strength is high.

In accordance with another conventional technique, a so-called "AGC circuit" for automatically controlling the gain of the high frequency amplifier stage according to the received electric field strength is provided in the receiver. Howerver, that technique is still disadvantageous in that, when the electric field strength is high, the operating point of the amplifying elements is greatly shifted as a result of which the input signal is distorted. Furthermore, recently, a so-called "vari-cap" (variable capacitance) diode has frequently been employed in a tuning circuit. However, the tuning circuit suffers from the difficulty that, since it is employed as a tank circuit in the antenna input section, intermodulation which is caused by the vari-cap diode in the tank circuit cannot be eliminated.

SUMMARY OF THE INVENTION

Accordingly, an object of the invention is to provide an input signal level control device for a receiver, which operates effectively and stably to protect the input signal from distortion, intermodulation and cross modulation.

A specific feature of the input signal level control device according to the invention resides in that when the received electric field strength reaches a certain value, the input level of a high frequency amplifier is attenuated, and when the electric field strength reaches a value larger than the aforementioned value, the gain of the high frequency amplifier means is controlled according to the field strength.

DESCRIPTION OF THE PREFERRED EMBODIMENTS

The invention will be described with reference to the accompanying drawings.

Figure 1:
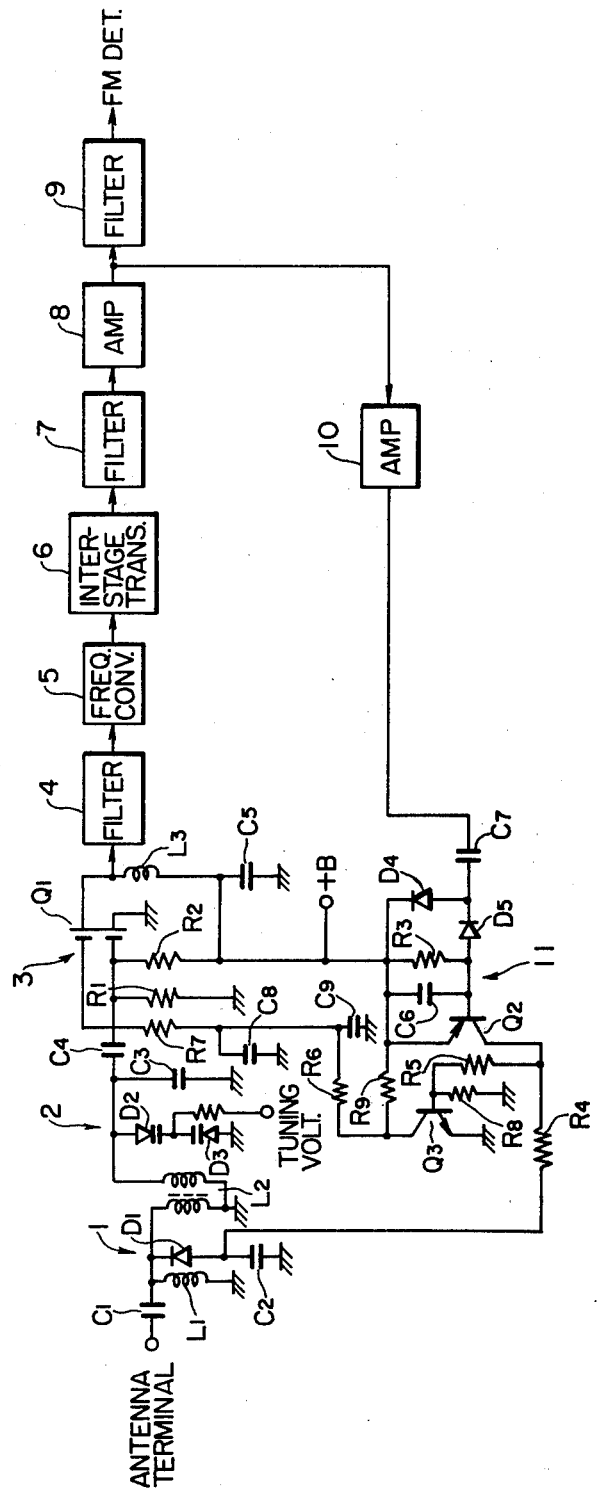
FIGS. 1 and 2 are circuit diagrams showing first and second embodiments of an input signal level control device of the invention.

FIG. 1 is a circuit diagram of a preferred embodiment of an input signal level control device according to the invention. A high frequency (radio frequency) signal present at an antenna terminal is applied to an attenuator 1 including a switching diode $D_1$ through an AM signal blocking and impedance converting capacitor $C_1$. A coil $L_1$ acts a correcting coil which, when the diode $D_1$ is rendered conductive, prevents variation of the antenna tuning characteristic. A capacitor $C_2$ is provided to connect the input signal to ground when the diode $D_1$ is turned on. The signal passed through the attenuator 1 is applied to an antenna tuning circuit 2 made up of variable capacitance diodes $D_2$ and $D_3$ and a capacitor $C_3$ and is then applied to a first gate electrode of a dual-gate type field-effect transistor $Q_1$ through a capacitor $C_4$. The transistor $Q_1$, a coil $L_3$, a capacitor $C_5$ and resistors $R_1$ and $R_2$ form a high frequency (radio frequency) amplifier circuit 3.

The output of the amplifier circuit 3 is applied through a filter 4 to a frequency converter circuit 5 where it is converted into an IF (intermediate frequency) signal. The IF signal is applied through an inter-stage IF transformer 6, a ceramic filter 7, and IF amplifier 8 and a ceramic filter 9 to an FM detector stage (not shown). The output of the IF amplifier 8 is amplified by a second amplifier 10 to provide a drive signal for an input level control circuit 11. The control circuit 11 has a rectifying and smoothing circuit made up of rectifying diodes $D_4$ and $D_5$, a smoothing capacitor $C_6$ and a resistor $R_3$. A coupling capacitor $C_7$ is provided between the amplifier 10 and the control circuit 11.

The smoothed output of the rectifying and smoothing circuit is applied as a control input to the base of a PNP transistor $Q_2$. The collector output of the transistor $Q_2$ is applied through a current limiting resistor $R_4$ to the control terminal of the switching diode $D_1$ to perform the on-off control of the diode $D_1$. The collector output of the transistor $Q_2$ is further applied as a control input to the base of an NPN transistor $Q_3$. The collector output of the transistor $Q_3$ is applied through resistors $R_6$ and $R_7$ to a second gate electrode of the high frequency amplifier transistor $Q_1$ to control the gain of the transistor $Q_1$. Resistors $R_8$ and $R_9$ are base and collector bias resistors of the transistor $Q_3$, respectively, and capacitors $C_8$ and $C_9$ are employed as bypass capacitors.

When, in the circuitry thus constructed, the received field strength is above a first predetermined value, the rectifying and smoothing level of the diodes $D_4$ and $D_5$ will exceed the threshold value of the transistor $Q_2$ thus absorbing the base current of the transistor $Q_2$ as a result of which the transistor $Q_2$ is rendered conductive and therefore a positive voltage $+B$ is applied to the switching diode $D_1$ through the resistor $R_4$. Accordingly, the diode $D_1$ is turned on and the input signal is attenuated by the capacitor $C_2$. If the field strength is further increased, the collector voltage of the transistor $Q_2$ will correspondingly increase towards the positive voltage $+B$. When the collector voltage reaches a second predetermined value, the transistor $Q_3$ is rendered conductive. Accordingly, the second gate bias of the amplifying transistor $Q_1$ is decreased and the amplification gain thereof is decreased. In this operation, as the "on" state of the transistor $Q_3$ is determined according to the received field strength, the amplification gain of the transistor $Q_1$ is also controlled according to the field strength whereby AGC (automatic gain control) operation is carried out.

Figure 2:
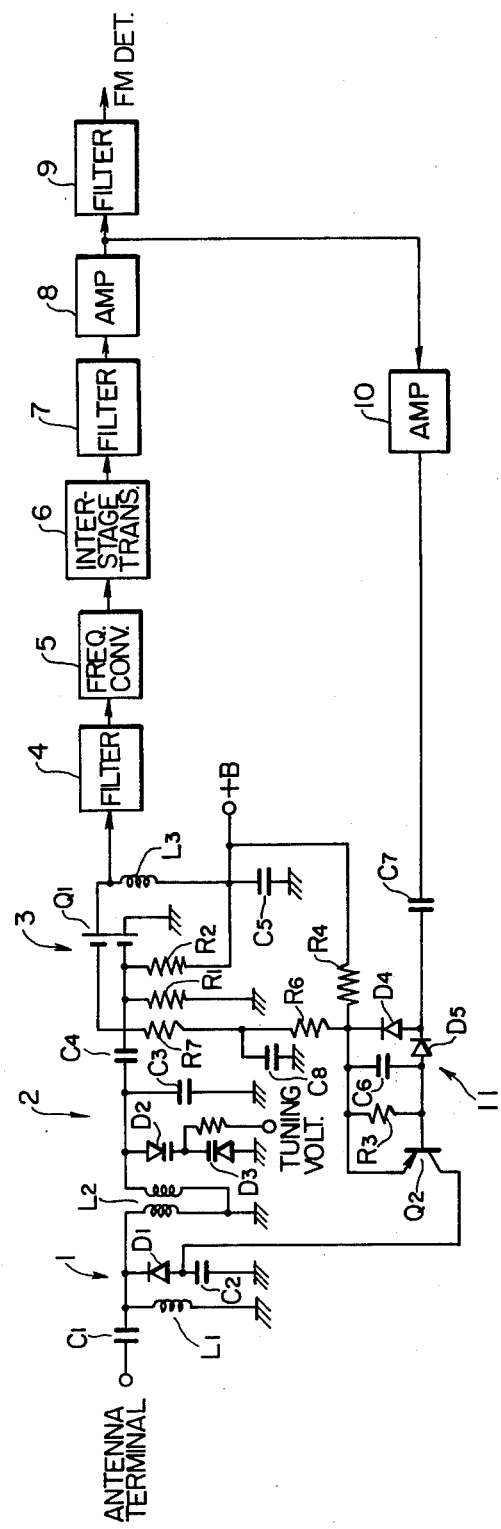

FIG. 2 is a circuit diagram showing another embodiment of the invention. In this embodiment, the control circuit 11 has a somewhat simpler arrangement than that in FIG. 1. Here, the transistor $Q_3$ (FIG. 1) for controlling the gain of the transistor $Q_1$ is eliminated and the emitter output potential of the transistor $Q_2$ is applied directly through the resistors $R_6$ and $R_7$ to the transistor $Q_1$. A resistor $R_4$ is connected between the power source $+B$ and the transistor $Q_2$.

When, in the circuitry thus constructed, the field strength reaches a certain value, the transistor $Q_2$ is rendered conductive and accordingly the input signal is attenuated. When the field strength is further increased, the current flowing in the transistor $Q_2$ increases. As a result, the voltage drop across the resistor $R_4$ is increased and the second gate electrode bias of the transistor $Q_1$ is decreased. In this manner, the AGC operation is carried out.

As is apparent from the above description, as the electric field strength increases, first the input signal level of the antenna is attenuated. As the field strength is further increased, the AGC operation is carried out. Therefore, an effective desirable amplification factor is obtained and the occurrence of signal distortion, cross modulation and intermodulation is prevented. Furthermore, the AGC operational range is increased. In addition, if the drive signal for the level control such as AGC is obtained from the IF signal formed as the output of the ceramic filter 7 in the IF stage, the AGC operation will be effected even in the presence of a strong interference signal whereby the circuitry of the invention is even more effective.

What is claimed is:

1. An input signal level control device for a receiver comprising: a first capacitor having a first terminal coupled to an antenna terminal; a first coil having a first terminal coupled to a second terminal of said first capacitor and a second terminal coupled to ground; a switching diode having a cathode terminal coupled to said first terminal of said first coil; a second capacitor having a first terminal coupled to an anode terminal of said first diode and a second terminal coupled to ground; an antenna tuning circuit having an input terminal coupled to said first terminal of said coil; a dual-gate field-effect transistor, one of source and drain electrodes of said field-effect transistor being coupled to ground; a third capacitor having a first terminal coupled to an output of said antenna tuning circuit and a second terminal coupled to a first gate of said field-effect transistor; a first resistor having a first terminal coupled to said first gate of said field-effect transistor and a second terminal coupled to ground; a second coil having a first terminal coupled to the other of said source and drain electrodes of said field-effect transistor; a second resistor having a first terminal coupled to said first gate of said field-effect transistor and a second terminal coupled to a second terminal of said second coil; a third capacitor having a first terminal coupled to said second terminal of said second coil and the second terminal coupled to ground; a first filter having an input coupled to said first terminal of said second coil; a frequency converter circuit having an input coupled to an output of said first filter; an inter-stage transformer having an input coupled to an output of said frequency converter; a second filter having an input coupled to an output of said inter-stage transformer; a first amplifier having an input coupled to an output of said second filter; a second amplifier having an input coupled to an output of said first amplifier; a fourth capacitor having a first terminal coupled to an output of said second amplifier; second and third diodes, an anode of said second diode being coupled to a cathode of said third diode and to a second terminal of said fourth capacitor; a third resistor having a first terminal coupled to an anode of said third diode and a second terminal coupled to a cathode of said second diode and to said second terminal of said second coil; a fifth capacitor coupled in parallel with said third resistor; a PNP transistor having a base coupled to said first terminal of said third resistor and an emitter coupled to said second terminal of said third resistor; a fourth resistor having a first terminal coupled to a collector of said PNP transistor and a second terminal coupled to said anode terminal of said first diode; a fifth resistor having a first terminal coupled to said collector of said PNP transistor; a sixth resistor having a first terminal coupled to a second terminal of said fifth resistor and a second terminal coupled to ground; an NPN transistor having a base coupled to said second terminal of said fifth resistor and an emitter coupled to ground; a seventh resistor having a first terminal coupled to a collector of said NPN transistor and a second terminal coupled to said emitter of said PNP transistor; an eighth resistor having a first terminal coupled to said collector of said NPN transistor; a sixth capacitor having a first terminal coupled to a second terminal of said sixth resistor and a second terminal coupled to ground; a ninth resistor having a first terminal coupled to said second terminal of said eigth resistor and a second terminal coupled to a second gate of said field-effect transistor, a positive supply voltage being applied to said emitter of said PNP transistor.

2. An input signal level control device for a receiver comprising: a first capacitor having a first terminal coupled to an antenna terminal; a first coil having a first terminal coupled to a second terminal of said first capacitor and a second terminal coupled to ground; a switching diode having a cathode terminal coupled to said first terminal of said first coil; a second capacitor having a first terminal coupled to and an anode terminal of said first diode and a second terminal coupled to ground; an antenna tuning circuit having an input terminal coupled to said first terminal of said coil; a dual-gate first-effect transistor, one of a source and drain electrodes of said field-effect transistor being coupled to ground; a third capacitor having a first terminal coupled to an output of said antenna tuning circuit and a second terminal coupled to a first gate of said field-effect transistor; a first resistor having a first terminal coupled to said first gate of said field-effect transistor and a second terminal coupled to ground; a second coil having a first terminal coupled to the other of said source and drain electrodes of said field-effect transistor; a second resistor having a first terminal coupled to said first gate of said field-effect transistor and a second terminal coupled to a second terminal of said second coil; a third capacitor having a first terminal coupled to said second terminal of said second coil and the second terminal coupled to ground; a first filter having an input coupled to said first terminal of said second coil; a frequency converter circuit having an input coupled to an output of said first filter; an inter-stage transformer having an input coupled to an output of said frequency converter; a second filter having an input coupled to an output of said inter-stage transformer; a first amplifier having an input coupled to an output of said second filter; a second amplifier having an input coupled to an output of said first amplifier; a fourth capacitor having a first terminal coupled to an output of said second amplifier; second and third diodes, an anode of said second diode being coupled to a cathode of said third diode and to a second terminal of said fourth capacitor; a third resistor having a first terminal coupled to an anode of said third diode and a second terminal coupled to a cathode of said second diode and to said second terminal of said second coil; a fifth capacitor coupled in parallel with said third resistor; a PNP transistor having a base coupled to said first terminal of said third resistor, an emitter coupled to said second terminal of said third resistor, and a collector coupled to said anode terminal of said first diode; a fourth resistor having a first terminal coupled to said emitter of said PNP transistor and a second terminal coupled to a positive voltage source and to said first terminal of said third capacitor; a fifth resistor having a first terminal coupled to said emitter of said PNP transistor; a sixth capacitor having a first terminal coupled to a second terminal of said fifth resistor and a second terminal coupled to ground; and a sixth resistor having a first terminal coupled to said second terminal of said fifth resistor and a second terminal coupled to a second gate of said field-effect transistor.

3. The input signal level control device of claim 1 or 2 wherein said antenna tuning circuit comprises a second coil having primary and secondary windings, a first terminal of said primary winding being coupled to said cathode terminal of said first diode, a second terminal of said primary winding being coupled to a first terminal of said secondary winding and to ground; first and second variable capacitance diodes having cathode terminals coupled together and to a source of a tuning voltage, an anode terminal of said first variable capacitance diode being coupled to ground and an anode terminal of said second variable capacitance diode being coupled to a second terminal of said secondary winding of said second coil; and a seventh capacitor having a first terminal coupled to said anode terminal of said second variable capacitance diode and a second terminal coupled to ground.

4. An input signal level control device for a receiver receiving an input signal having a particular electric field strength, comprising: an input signal source; an attenuating means for attenuating a level of said input signal; an amplifier means for amplifying said attenuated input signal; a signal processing means for processing said amplified signal; and a control means receiving said processed signal, said control means activating said attenuating means when said electric field strength of said input signal reaches a first level and controlling said amplifying means when said electric field strength of said input signal reaches a second level greater than said first level, said control means having a first transistor coupled with a second transistor, said attenuating means being activated by an output of said first transistor and said amplifier means being controlled by an output of said second transistor.

5. An input signal level control device for a receiver receiving an input signal having a particular electric field strength, comprising: an input signal source; an attenuating means for attenuating a level of said input signal; an amplifier means for amplifying said attenuated input signal; a signal processing means for processing said amplified signal; and a control means receiving said processed signal for both activating said attenuating means when said electric field strength of said input signal reaches a first level and controlling said amplifying means when said electric field strength of said input signal reaches a second level greater than said first level, said control means comprising an input amplifier having an input coupled to an output of an IF amplifier of said processing means, a rectifying and smoothing circuit having an input coupled to an output of said input amplifier, a first amplifying transistor having a base input coupled to an output of said rectifying and smoothing circuit, a second amplifying transistor having a base input coupled to a collector output of said first transistor, said collector output of said first transistor being connected to said attenuating means, and a collector output of said second amplifying transistor being coupled to a gain control input of said amplifier means.

6. The input signal level control device of either one of claims 4 or 5, wherein said attenuating means comprises a switching diode operatively coupled to an antenna terminal of said receiver.

7. The input signal level control device of either one of claims 4 or 5, wherein said attenuating means comprises a switching diode operatively coupled to an antenna terminal of said receiver, and further comprising an antenna-tuning circuit operatively coupled between said diode and said high frequency amplifying means.

8. The input signal level control device of either one of claims 4 or 5, wherein said amplifier means comprises a dual-gate type field effect transistor.

* * * * *